(12) United States Patent
Lim et al.

(10) Patent No.: US 9,997,504 B2
(45) Date of Patent: Jun. 12, 2018

(54) ELECTRONIC DEVICE MODULE AND METHOD OF MANUFACTURING THE SAME

(71) Applicant: SAMSUNG ELECTRO-MECHANICS CO., LTD., Suwon-si (KR)

(72) Inventors: Jae Hyun Lim, Suwon-si (KR); Jong In Ryu, Suwon-si (KR); Sung Ho Kim, Suwon-si (KR); Jin Su Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 109 days.

(21) Appl. No.: 15/075,824

(22) Filed: Mar. 21, 2016

(65) Prior Publication Data

US 2017/0018540 A1    Jan. 19, 2017

(30) Foreign Application Priority Data

Jul. 13, 2015  (KR) .......................... 10-2015-0099286

(51) Int. Cl.
*H05K 1/11* (2006.01)
*H01L 25/16* (2006.01)
(Continued)

(52) U.S. Cl.
CPC .............. *H01L 25/16* (2013.01); *H01L 21/78* (2013.01); *H01L 23/49822* (2013.01); *H01L 23/49833* (2013.01); *H01L 23/49838* (2013.01); *H01L 24/97* (2013.01); *H01L 21/561* (2013.01); *H01L 21/565* (2013.01); *H01L 23/3128* (2013.01); *H01L 24/13* (2013.01); *H01L 24/16* (2013.01); *H01L 24/48* (2013.01); *H01L 2224/131* (2013.01); *H01L 2224/16227* (2013.01); *H01L 2224/48227* (2013.01); *H01L 2224/97* (2013.01); *H01L 2924/00014* (2013.01); *H01L 2924/14* (2013.01); *H01L 2924/15311* (2013.01); *H01L 2924/15787* (2013.01); *H01L 2924/15788* (2013.01); *H01L 2924/181* (2013.01); *H01L 2924/18161* (2013.01);
(Continued)

(58) Field of Classification Search
CPC .......... H05K 1/14; H05K 1/141; H05K 1/145; H05K 2201/049; H05K 1/144; H05K 2201/041; H05K 2201/042; H05K 2201/043; H01R 23/68; H01R 23/6886
USPC ......................... 361/784, 785, 790, 791, 803
See application file for complete search history.

(56) References Cited

U.S. PATENT DOCUMENTS

| | | | |
|---|---|---|---|
| 6,343,171 B1 * | 1/2002 | Yoshimura | G02B 6/12002 257/E23.01 |
| 2013/0048361 A1 | 2/2013 | Yamashita et al. | |
| 2014/0084416 A1 * | 3/2014 | Kang | H01L 25/105 257/532 |

FOREIGN PATENT DOCUMENTS

| | | |
|---|---|---|
| JP | 2013-51336 A | 3/2013 |
| KR | 10-2014-0039736 A | 4/2014 |

* cited by examiner

*Primary Examiner* — Binh Tran
(74) *Attorney, Agent, or Firm* — NSIP Law

(57) ABSTRACT

In one general aspect, an electronic device module includes a first board, a first device mounted on a first surface of the first board, a second board disposed below the first board, and a plurality of second devices disposed between the first board and the second board, wherein a surface of each second device the plurality of second devices is bonded to a second surface of the first board and another surface of each of the second devices is bonded to the second board.

11 Claims, 7 Drawing Sheets

(51) Int. Cl.
| | | |
|---|---|---|
| *H01L 23/498* | (2006.01) | |
| *H01L 21/78* | (2006.01) | |
| *H05K 1/14* | (2006.01) | |
| *H01L 21/56* | (2006.01) | |
| *H01R 12/50* | (2011.01) | |
| *H01L 23/31* | (2006.01) | |
| *H01L 23/00* | (2006.01) | |

(52) U.S. Cl.
CPC ............... *H01L 2924/19041* (2013.01); *H01L 2924/19042* (2013.01); *H01L 2924/19043* (2013.01); *H01L 2924/19105* (2013.01); *H01L 2924/19106* (2013.01); *H01R 23/68* (2013.01); *H01R 23/6886* (2013.01); *H05K 1/14* (2013.01); *H05K 1/141* (2013.01); *H05K 1/144* (2013.01); *H05K 1/145* (2013.01); *H05K 2201/041* (2013.01); *H05K 2201/042* (2013.01); *H05K 2201/043* (2013.01); *H05K 2201/049* (2013.01)

ELECTRONIC DEVICE MODULE AND METHOD OF MANUFACTURING THE SAME

CROSS-REFERENCE TO RELATED APPLICATION

This application claims the benefit under 35 USC 119(a) of Korean Patent Application No. 10-2015-0099286, filed on Jul. 13, 2015 with the Korean Intellectual Property Office, the entire disclosure of which is incorporated herein by reference for all purposes.

BACKGROUND

1. Field

The following description relates to an electronic device module being significantly decreased in size, and a method of manufacturing the same.

2. Description of Related Art

In the electronic products market, the demand for portable devices has continued to increase. Therefore, the miniaturization and lightness of electronic devices mounted in electronic products has continuously been demanded. In order to realize the miniaturization and lightness of electronic devices as described above, a system on chip (SOC) technology of implementing a plurality of individual devices on one chip, a system in package (SIP) technology of integrating a plurality of individual devices in one package, or the like, as well as technology for decreasing individual sizes of mounting components has been desired.

In order to manufacture an electronic device module having high performance while having a compact size, a structure in which devices are stacked and mounted has been developed. However, due to stacking the devices as described above, a total size of the electronic device module is increased, thus preventing miniaturization of portable devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a first board, a first device mounted on a first surface of the first board, a second board disposed below the first board, and a plurality of second devices disposed between the first board and the second board, wherein a surface of each second device the plurality of second devices is bonded to a second surface of the first board and another surface of each of the second devices is bonded to the second board.

The electronic device module may further include a plurality of external connection terminal disposed on a lower surface of the second board.

The connection terminals may be formed on the surfaces of each second device of the plurality of second devices and the plurality of second devices are bonded to the first and second boards through the connection terminals. The first and second boards may be electrically connected to each other through the connection terminals of the plurality of second devices.

The plurality of second devices may include an electronic component having a hexahedral shape, and each of the second devices have the same or similar thickness as each other.

The second device may include at least one electronic component and at least one dummy device.

The electronic device module may further include an encapsulation part encapsulating the first and second devices. The first board may be embedded in the encapsulation part and a side surface of the first board may be externally exposed.

In another general aspect, a method of manufacturing an electronic device module includes mounting a first device on one surface of a first board, bonding a plurality of second devices on another surface of the first board, and bonding the second devices to a second board.

The method may further include forming an encapsulation part encapsulating at least one first device and the second devices.

The first surfaces of the second devices may be bonded to the other surface of the first board, and second surfaces of the second devices may be bonded to the second board.

The second devices may include a plurality of electronic components having the same thickness as each other.

The first and second boards may be strip type boards in which a plurality of mounting regions are repetitively arranged. The first and second boards and the encapsulation part may be cut between each mounting region.

In another general aspect, an electronic device module includes a first board, a first device mounted on a first surface of the first board, a second board disposed below the first board, a plurality of second devices disposed between the first board and the second board, wherein the surfaces of the plurality of second devices are bonded to a second surface of the first board and another surface of the plurality of second devices is bonded to the second board to form a plurality of gaps between the first board and the second board, and an encapsulating part encapsulating the first board and one surface of the second board, wherein the gaps between the first board and second board accommodate portions of the encapsulating part.

The plurality of second devices may further include connection terminals. The connection terminals may be connected to the first board and the second board.

A surface of the first device may be externally exposed. Side surfaces of the first board and the second board may be externally exposed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
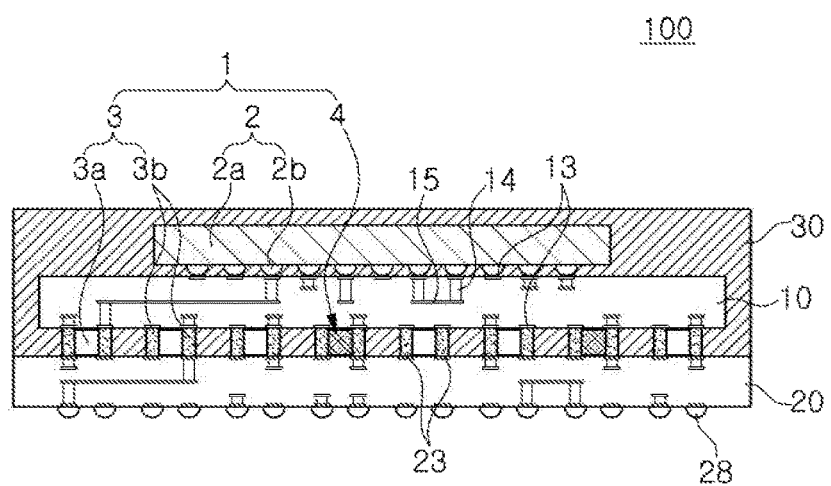
FIG. 1 is a cross-sectional view schematically illustrating an electronic device module according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

FIG. 1 is a cross-sectional view schematically illustrating an electronic device module according one or more embodiments. In addition, FIG. 2 is a partially cut-away perspective view illustrating an internal portion of the electronic device module illustrated in FIG. 1, and FIG. 3 is an exploded perspective view of the electronic device module illustrated in FIG. 1.

Figure 2:
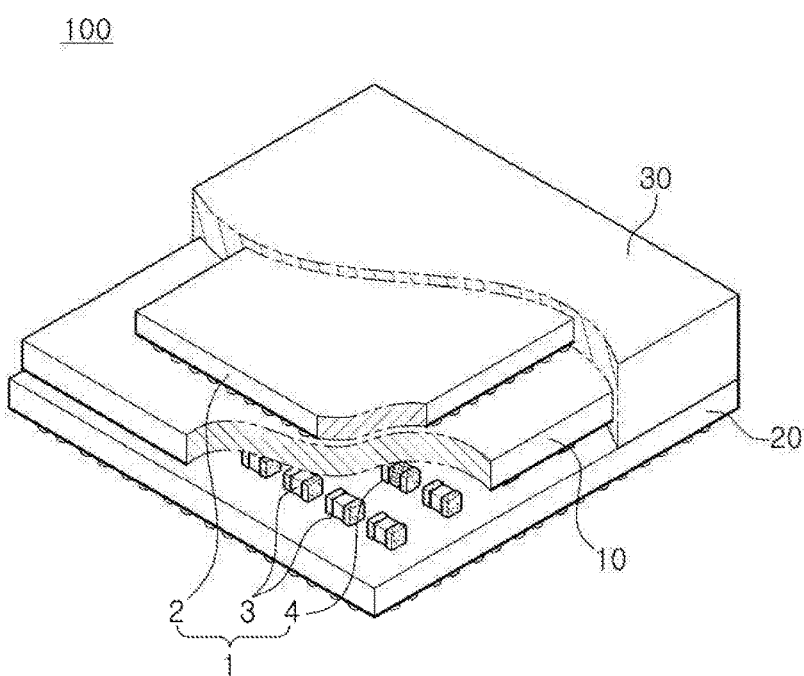
FIG. 2 is a partially cut-away perspective view illustrating an internal portion of the electronic device module according to one or more embodiments.
Figure 3:
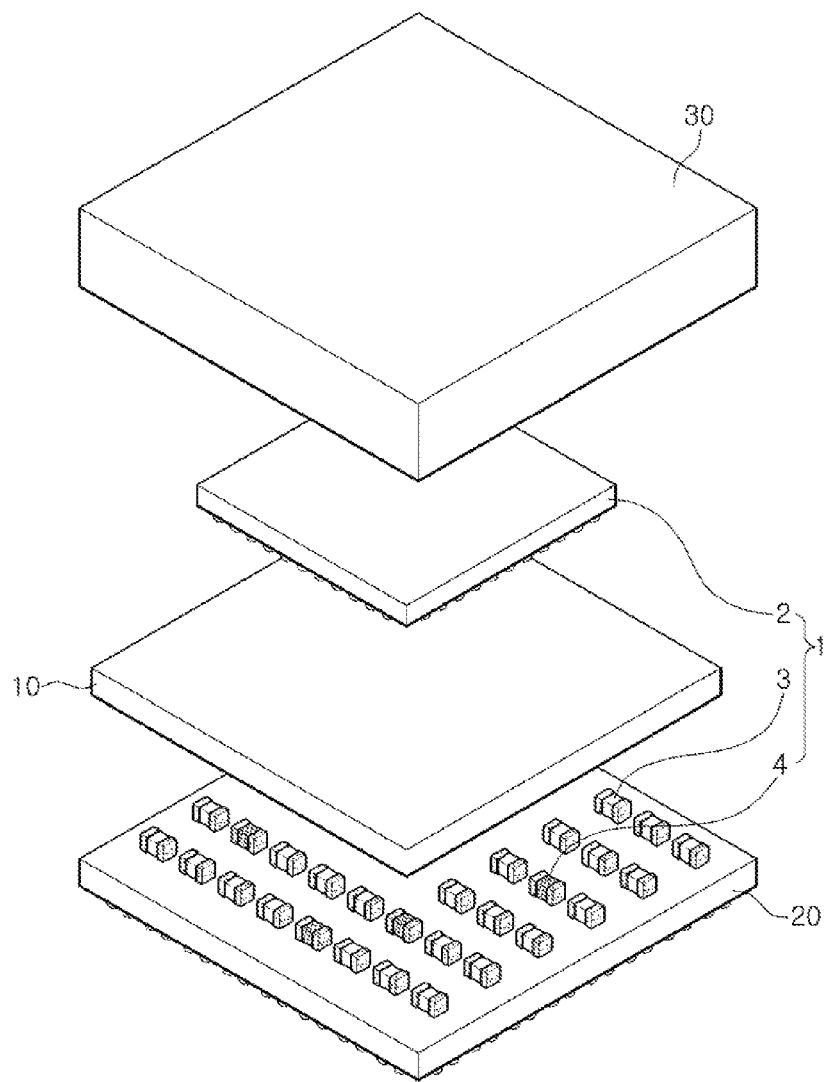
FIG. 3 is an exploded perspective view of the electronic device module according to one or more embodiments.

Referring to FIGS. 1 through 3, an electronic device module 100 according to an embodiment includes an electronic device 1, a first board 10, a second board 20, and an encapsulation part 30.

The electronic device 1 includes at least one first device 2 and at least one second device 3. The electronic device 1 may be any electronic component as long as it can be mounted on the first board 10. For example, the electronic device 1 may be an active device or a passive device.

The first device 2 may be a device having a large mounting area. For example, the first device 2 may be a device having a size at which a mounting area thereof occupies at least half of an area of the first board 10, and having an upper surface formed to be flat. However, the first device 2 is not limited thereto and may be varied.

The first device 2 according to an embodiment includes a flat body 2a and may be bonded to one surface of the first board 10 through a plurality of connection terminals 2b disposed on a lower surface of the body 2a. Therefore, as the first device 2, an active device such as an integrated circuit (IC) or a package device may be used, and the connection terminals 2b may be formed of solder balls or solder bumps.

The first device 2 may be mounted on the first board 10 in a flip-chip form. However, the first device 2 is not limited thereto, and may be varied. For example, if desired, the first device 2 may be electrically connected to the first board 10 through a bonding wire.

The second device 3 may be a device of which connection terminals 3b are disposed on both upper and lower surfaces of a body 3a. The connection terminals 3b may function as a spacer and a connection terminal.

A plurality of second devices 3 may be disposed on one surface of the second board 20 and are interposed between the first and second boards 10 and 20 to thereby electrically connect the first and second boards 10 and 20 to each other. For example, in the second device 3, the connection terminals 3b formed on the upper surface and the connection terminals 3b formed on the lower surface are electrically connected to each other. Further, the second device 3 may be disposed between the first and second boards 10 and 20 to maintain a constant interval between the first and second boards 10 and 20. Therefore, the second devices 3 have the same height as each other.

The second devices are electronic components having relatively small sizes as compared to the first device 2. For example, second devices 3 may have a box-shaped exterior, such as capacitors, inductors, or resistors. However, the second devices 3 are not limited thereto, and may be varied.

The connection terminals 3b of the second device 3 may be planar or have protrusions, and may be bonded to the boards 10 and 20 through a conductive adhesive such as a solder. However, a bonding method of the second device 3 is not limited thereto, and may be varied. For example, the second device 3 may be mounted on the boards 10 and 20 by a flip-chip bonding method.

Additionally, the electronic devices 1 according to an embodiment may include at least one dummy device 4. The dummy device 4 is a device which is formed to have the same exterior as that of the second devices 3 but does not perform any function internally. Therefore, the dummy device 4 may be mounted on the second board 20 together with the second devices 3 to function as a spacer and a connection terminal, but does not function as an electronic component.

The dummy device 4 as described above may be provided in order to simply electrically connect the first and second boards 10 and 20 to each other or allow the first and second boards 10 and 20 to be spaced apart from each other, or both. The dummy device 4 may be omitted when the first and second boards 10 and 20 are completely electrically connected to each other only with the electronic components or the first and second boards 10 and 20 are stably spaced apart from each other without the dummy device 4.

The electronic devices 1 according to one or more embodiments are not limited to the first and second devices 2 and 3, and may further include various other devices in addition to the first and second devices. For example, the electronic devices 1 may include various devices such as a device mounted around the first device on the first board 10 or a device mounted on the second board 20 and having a thickness more reduced than that of the second device 3.

The first board 10 may be various kinds of boards (for example, a ceramic board, a printed circuit board, a glass board, or a flexible board). Further, electrode pads 13 for mounting the electronic devices 1 or wiring patterns electrically connecting the electrode pads 13 to each other may be formed on both surfaces of the first board 10.

The first board 10 may be a multilayer board including a plurality of layers, and circuit patterns 15 for forming electrical connection are formed between respective layers.

Further, the first board 10 includes conductive vias 14 electrically connecting the electrode pads 13 formed on both surfaces thereof to the circuit patterns 15 formed in the first board 10.

In addition, the first board 10 according to one or more embodiments has an area smaller than that of a second board 20 to be described below. Therefore, the first board 10 may be completely encapsulated in an encapsulation part 30 to be described below. Thus, only the encapsulation part 30 and the second board 20 of the electronic device module 100 are externally exposed. However, the first board 10 is not limited thereto, and if desired, the first board 10 may be partially externally exposed.

The second board 20 is disposed below the first board 10 and may be electrically and physically connected to the first board 10 via the second device 3. Similarly to the first board 10, various kinds of boards (for example, a ceramic board, a printed circuit board, a glass board, or a flexible board) may be used as the second board 20, and the second board 20 may have the same or different structure as that of the first board. However, the second board 20 is not limited thereto and may be varied.

If desired, an external connection terminal 28 may be formed on a lower surface of the second board 20. The external connection terminal 28 may electrically and physically connect the electronic device module 100 to a main board on which the electronic device module 100 is mounted. Therefore, the first device 2 mounted on the first board 10 may be electrically connected to the second board 20 and the external connection terminal 28 through the second devices 3.

The external connection terminal 28 may be formed in a solder ball shape. However, the external connection terminal 28 is not limited thereto, and may be formed in various shapes such as a solder bump shape, a solder pad shape, or the like.

The encapsulation part 30 encapsulates all of the electronic devices 1 mounted on the first board 10. Further, the encapsulation part 30 may also be disposed between the electronic devices 1 mounted on the first and second boards 10 and 20, and thus the encapsulation part 30 may prevent electrical short circuits from being generated between the electronic devices 1 and may further fix the electronic devices 1 onto the first board 10 while enclosing outer portions of the electronic devices 1, thereby safely protecting the electronic devices from external impact.

The encapsulation part 30 may be formed of an insulating resin such as an epoxy. Further, the encapsulation part 30 may be formed by seating the first board 10 on which the electronic devices 1 are mounted in a mold and injecting a resin into the mold.

The encapsulation part 30 according to one or more embodiments is formed so that the first device 2 is completely embedded therein. However, the encapsulation part 30 is not limited thereto, and may be formed so that at least one of the electronic devices 1 mounted on the first board 10 is partially externally exposed. Further, the encapsulation part 30 may also be provided in all spaces formed between the first and second boards 10 and 20.

The encapsulation part 30 may be formed by an injection molding method or another molding method. For example, an epoxy mold compound (EMC) may be used as a material of the encapsulation part 30. However, a formation method of the encapsulation part 30 is not limited thereto, and in order to form the encapsulation part 30, if necessary, various methods such as a method of compressing a semi-cured resin may be used.

In the electronic device module 100 according to one or more embodiments as described above, the electronic devices 1 may be mounted on both surfaces of the first board 10. Further, the external connection terminal 28 may be formed on the second board 20 disposed below a lower surface of the first board 10. Therefore, since a plurality of electronic devices 1 may be mounted on both surfaces of the first board 10, a degree of integration of the devices may be increased. Further, since a spaced distance between the first and second boards 10 and 20 is the same as the thickness of the second device 3, which is the electronic component, a total thickness of the electronic device module 100 may be significantly decreased. Therefore, even if the electronic device module includes a large number of electronic devices, the electronic device module may be easily used in a thin electronic apparatus.

Next, a method of manufacturing an electronic device module according one or more embodiments will be described.

FIGS. 4 through 9 are cross-sectional views depicting the method of manufacturing an electronic device module according to one or more embodiments.

Figure 4:
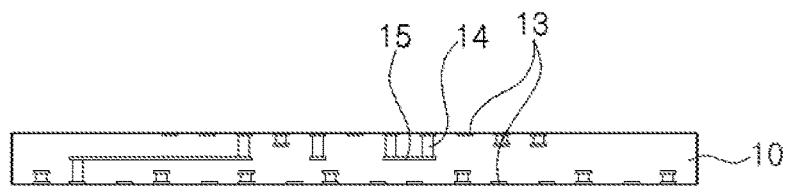
FIGS. 4 through 9 are cross-sectional views illustrating a method of manufacturing an electronic device module according to one or more embodiments.

First, as illustrated in FIG. 4, a first board 10 may be prepared. As described above, the first board 10 may be a multilayer board, and electrode pads 13 are formed on both surfaces of the first board 10.

The first board 10 may be a strip type board (hereinafter referred to as a strip board). Here, the strip board 10 is a board in which a plurality of mounting regions, which are the same as each other, are repetitively arranged in order to simultaneously manufacture a plurality of individual electronic device modules 100. In detail, the strip board 10 may have a tetragonal shape or a long strip shape with a wide area. In this case, the electronic device module 100 may be manufactured in each of the plurality of mounting regions.

Figure 5:
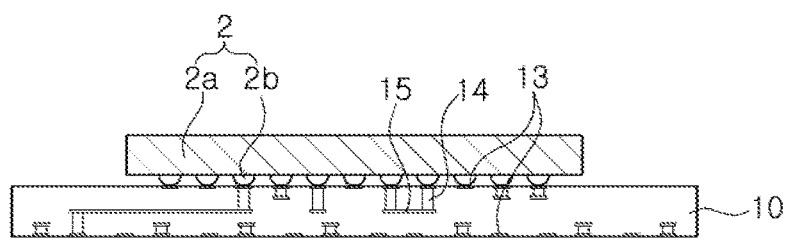

Referring to FIG. 5, a first device 2 is mounted on one surface of the first board 10. The mounting of the first device 2 may be performed by disposing at least one first device 2 on one surface of the first board 10 and applying heat thereto to melt and cure a connection terminal 2b of the first device 2.

Figure 6:
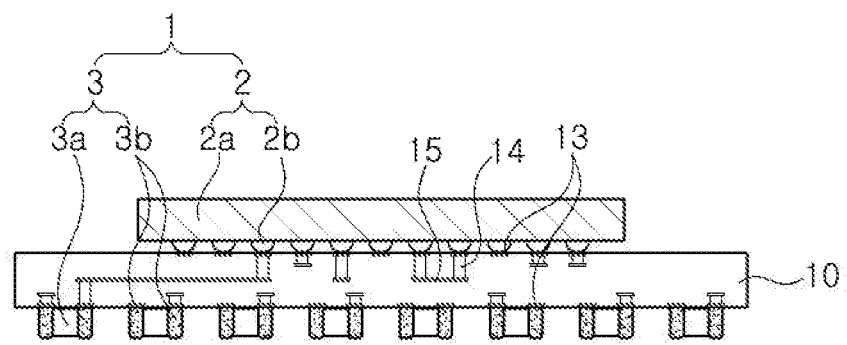

Referring to FIG. 6, second devices 3 are mounted on the other surface of the first board 10. The mounting of the second devices 3 may be performed by printing a solder paste on the electrode pads 13 formed on the other surface of the first board 10 by a screen printing method, disposing the second devices 3 thereon, and applying heat thereto to thereby cure the solder paste. Therefore, the electronic devices 1 are mounted on both surfaces of the first board 10.

Figure 7:
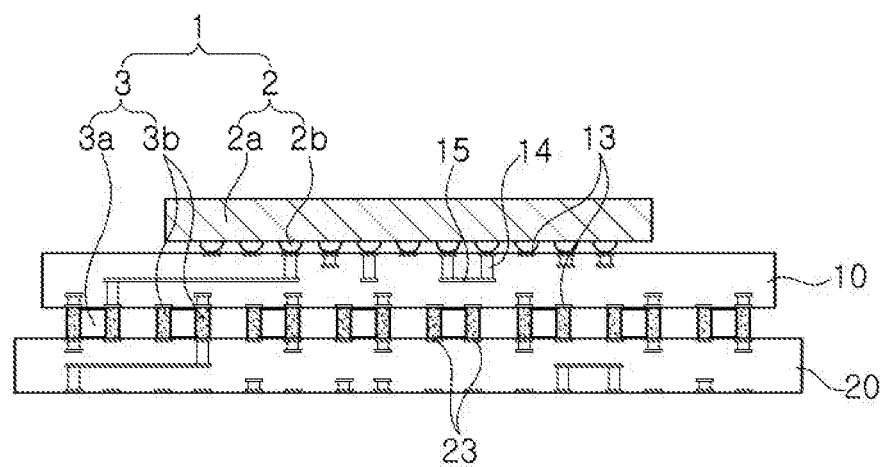

Referring to FIG. 7, the first board 10 may be mounted on one surface of the second board 20 through the second devices 3. In order to bond the second device 3 to the second board 20, solder paste may be printed on electrode pads 23 formed on the second board 20 by a screen printing method. Then, the first board 10 and the second devices 3 are disposed on the second board 20 and the printed solder paste. Subsequently, the second device 3 and the second board 20 may be bonded to each other by applying heat to the solder paste to melt and cure the solder paste. Thus, the first board 10 is connected to the second board 20 through the second device 3 and solder paste.

As an example only, in a case in which the first board 10 is a strip board, before bonding of the second devices 3 to the second board 20, the strip board is cut at each of the mounting regions to form an individual module. However, the sequence is not limited thereto, and may be varied. For example, after the bonding of the second devices 3 to the second board 20, the first and second boards 10 and 20 may be simultaneously cut, or after forming an encapsulation part to be described below, the cutting may be performed. In this case, a strip type board, similar to the first board 10, may be used as the second board 20.

Figure 8:
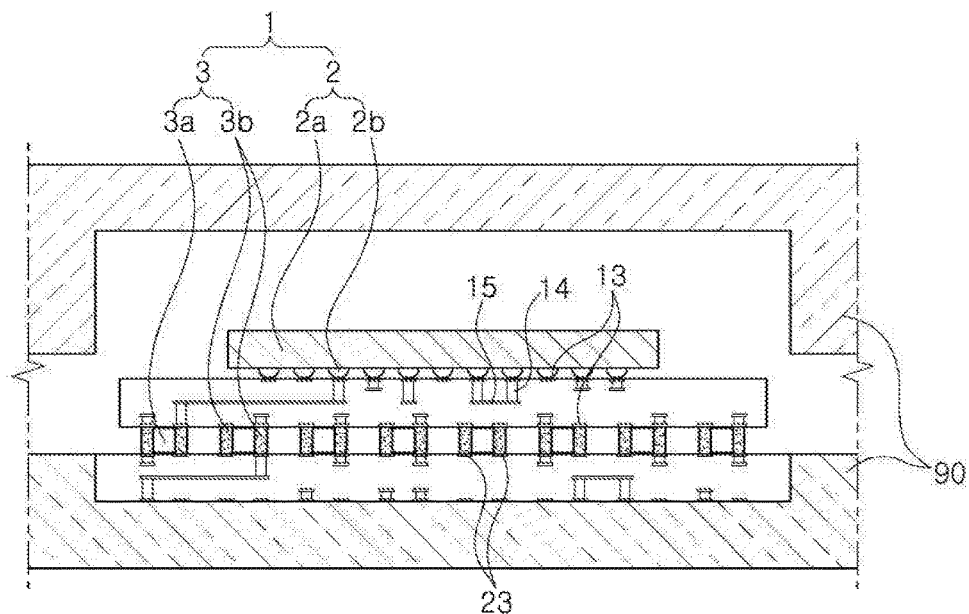
Figure 9:
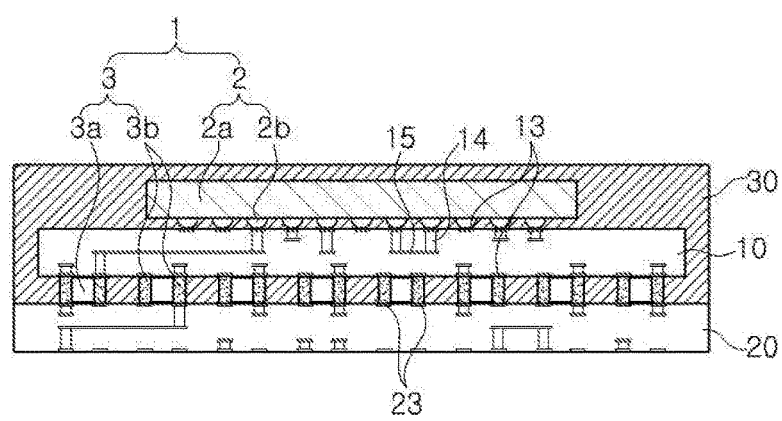

Next, the encapsulation part 30 is formed. In the forming of the encapsulation part 30, the first board 10 on which the electronic devices 1 are mounted is disposed in a mold 90 as illustrated in FIG. 8. The encapsulation part 30 may be formed by injecting a molding resin into the mold 90. In this case, since the molding resin is injected in a state in which a lower surface of the second board contacts an inner surface of the mold 90, the lower surface of the second board is not embedded in the encapsulation part 30, and may be exposed externally exposed as shown in FIG. 9.

Further, in the injecting of the molding resin, the molding resin may be further disposed in spaces formed between the first and second boards 10 and 20. As described above, the first board 10 may have an area smaller than that of the second board 20. Therefore, the molding resin may fill in all spaces on the first board 10, between the first and second boards 10 and 20, and a gap between the first board 10 and the mold.

Therefore, the first and second boards 10 and 20 may be insulated from each other by the encapsulation part 30 provided between the first and second boards 10 and 20, and the coupling strength between the first and second boards 10 and 20 may be increased.

The encapsulation part 30 according to one or more embodiments may be formed of an epoxy mold compound (EMC). However, a formation method of the encapsulation part 30 is not limited thereto, and in order to form the encapsulation part 30, various methods such as a method of compressing a semi-cured resin, a method of injecting a liquid resin in a dispensing scheme and curing the injected resin, may be used.

Next, external electrode terminals 28 may be formed on the lower surface of the second board 20, thereby completing the electronic device module illustrated in FIG. 1. The external connection terminals 28 are formed on the electrode pad 23 formed on the lower surface of the second board 20 in a bump shape. However, the external connection terminals 28 are not limited thereto, and may be formed in various shapes such as a solder ball. Further, in a case in which there is no desire for the external connection terminal, the forming of the external connection terminal may be omitted.

In the method of manufacturing an electronic device module according to one or more embodiments as described above, the encapsulation part may be formed on both upper and lower portions of the first board by a single process step. In addition, since the first and second boards are electrically connected to each other using a surface-mount technology (SMT), the electronic device module may be easily manufactured.

The electronic device module and the manufacturing method thereof are not limited to the embodiments described above, and may be variously modified.

Figure 10:
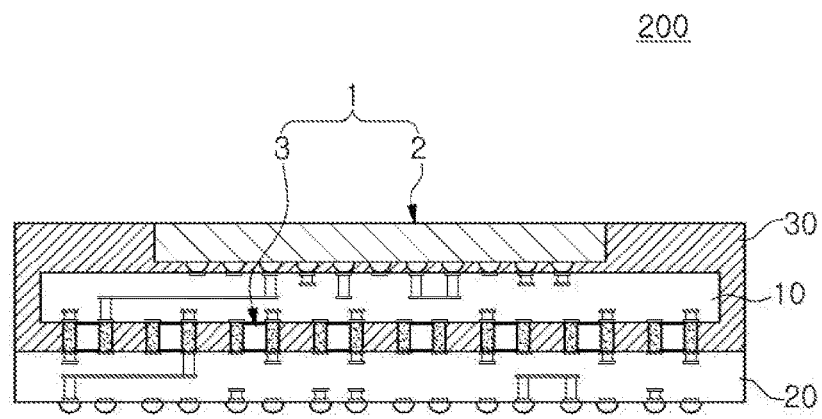
FIG. 10 is a cross-sectional view schematically illustrating an electronic device module according to another embodiment.

FIG. 10 is a cross-sectional view schematically illustrating a mounting structure of an electronic device module according to another embodiment. Referring to FIG. 10, in an electronic device module 200 according to another embodiment, an upper surface of a first device 2 is externally exposed from an encapsulation part 30.

In this case, since the encapsulation part 30 is not formed on an outer portion, that is, an upper portion of the first device 2, a thickness of the encapsulation part 30 formed on a first board 10 corresponds to a mounting height of the first device 2. Therefore, the thickness of the encapsulation part 30 may be significantly decreased, and thus, a thickness of the electronic device module 200 may also be significantly decreased.

Figure 11:
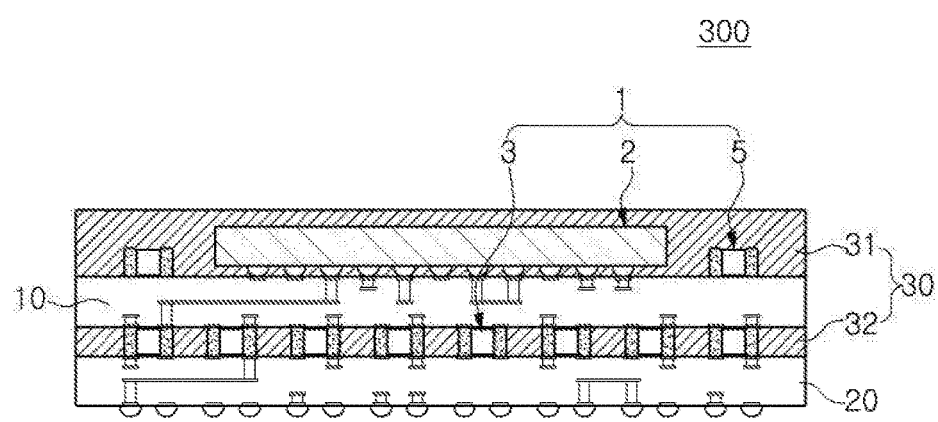
FIG. 11 is a cross-sectional view schematically illustrating an electronic device module according to another embodiment.

FIG. 11 is a cross-sectional view schematically illustrating a mounting structure of an electronic device module according to another embodiment. Referring to FIG. 11, in an electronic device module 300 according to another embodiment, first and second boards 10 and 20 are formed to have the same area as each other, and thus, a side surface of the first board 10 is externally exposed from an encapsulation part 30.

In this case, the encapsulation part 30 is divided into a first encapsulation part 31 formed on the first board 10, and a second encapsulation part 32 formed on the second board 20. Further, electronic devices 1 include a third device 5 mounted on the first board 10. The third device 5 may be an electronic component or passive device the same as or similar to a second device 3. However, the third device 5 is not limited thereto, and may be varied.

A structure of the electronic device module 300 may be formed by manufacturing both of the first and second boards 10 and 20 using strip type boards. In more detail, a method of manufacturing an electronic device module according to the one or more embodiments may be performed similarly to the method of manufacturing an electronic device module described above, but strip boards may be used as the first and second boards 10 and 20.

In addition, after stacking and encapsulating the first and second boards 10 and 20, the encapsulated first and second boards for each of the mounting regions of an individual module 100 may be cut. In the cutting, the encapsulation part 30, the first board 10, and the second board 20 may be simultaneously cut, and thus, the side surface of the first board 10 is externally exposed from the encapsulation part 30.

As set forth above, according to one or more embodiments, since the electronic devices are mounted on both surfaces of the first board, the electronic device module may increase the degree of integration of the devices. Further, since the spaced distance between the first and second boards is the same as the thickness of the second devices, the total thickness of the electronic device module may be significantly decreased, and thus, the electronic device module may be easily used in the thin electronic apparatus.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a first board;
   a first device mounted on a first surface of the first board;
   a second board disposed below the first board; and
   a plurality of second devices disposed between the first board and the second board,
   wherein a surface of each second device of the plurality of second devices is bonded to a second surface of the first board and another surface of each of the second devices is bonded to the second board,
   the plurality of second devices includes an electronic component having a hexahedral shape,
   each of the second devices have the same or similar thickness as each other,
   the plurality of second devices comprises at least one electronic component and at least one dummy devices having no internal function, and
   each dummy device comprise connection terminals disposed on upper and lower surfaces of a body.

2. The electronic device module of claim 1, further comprising a plurality of external connection terminal disposed on a lower surface of the second board.

3. The electronic device module of claim 1, wherein the plurality of second devices are bonded to the first and second boards through the connection terminals.

4. The electronic device module of claim 3, wherein the first and second boards are electrically connected to each other through the connection terminals of the plurality of second devices.

5. The electronic device module of claim 1, further comprising an encapsulation part encapsulating the first and second devices.

6. The electronic device module of claim 5, wherein the first board is embedded in the encapsulation part.

7. The electronic device module of claim 5, wherein a side surface of the first board is externally exposed.

8. An electronic device module comprising:
   a first board;
   a first device mounted on a first surface of the first board;
   a second board disposed below the first board;
   a plurality of second devices disposed between the first board and the second board, wherein surfaces of the plurality of second devices are bonded to a second surface of the first board and another surface of the plurality of second devices is bonded to the second board to form a plurality of gaps between the first board and the second board; and
   an encapsulating part encapsulating the first board and one surface of the second board, wherein the gaps between the first board and second board accommodate portions of the encapsulating part,
   wherein the plurality of second devices includes an electronic component having a hexahedral shape,
   each of the second devices has the same or similar thickness as each other,
   the plurality of second devices comprises at least one electronic component and at least one dummy device having no internal function, and
   each dummy device comprises connection terminals disposed on upper and lower surfaces of a body.

9. The electronic device module of claim 8, wherein the connection terminals are connected to the first board and the second board.

10. The electronic device module of claim 8, wherein a surface of the first device is externally exposed.

11. The electronic device module of claim 8, wherein side surfaces of the first board and the second board are externally exposed.

* * * * *